United States Patent [19]

Suhr et al.

[11] Patent Number: 5,013,581

[45] Date of Patent: May 7, 1991

[54] METHOD OF MAKING A POLYMER-METAL COMPOUND HAVING A PREDETERMINED ELECTRICAL CONDUCTIVITY BY DEPOSITING ON A SUBSTRATE FROM A GLOW DISCHARGE ZONE

[75] Inventors: Harald Suhr; Angelika Etspüler, both of Tübingen; Ernst Feurer, Tübingen-Hirschau; Christian Oehr, Reusten, all of Fed. Rep. of Germany

[73] Assignee: Schering Aktiengesellschaft, Berlin and Bergkamen, Fed. Rep. of Germany

[21] Appl. No.: 561,934

[22] Filed: Aug. 2, 1990

Related U.S. Application Data

[63] Continuation-in-part of Ser. No. 193,589, May 12, 1988.

[30] Foreign Application Priority Data

May 12, 1987 [DE] Fed. Rep. of Germany ....... 3716235

[51] Int. Cl.$^5$ .............................................. B05D 3/06
[52] U.S. Cl. ........................................ 427/41; 427/39; 427/44; 427/109; 427/124; 427/125; 427/252; 427/253; 427/255; 427/255.1

[58] Field of Search .................... 427/39, 41, 44, 109, 427/124, 125, 252, 253, 255, 255.1

*Primary Examiner*—Bernard Pianalto
*Attorney, Agent, or Firm*—Michael J. Striker

[57] ABSTRACT

The method of making an electrically conductive polymer-metal compound having a predetermined electrical conductivity on a substrate includes the steps of preparing a reaction mixture of a gaseous metallo-organic compound, a metal-free gaseous organic compound and a carrier gas such as argon or mixtures of argon and hydrogen, producing a glow discharge zone in the reaction mixture and exposing the substrate to action of the gaseous metallo-organic compound and the metal-free gaseous organic compound in the glow discharge zone in such a way as to produce a film or layer of the polymer-metal compound with a predetermined electrical conductivity. The selection of the electrical conductivity can be made by setting at least one of a number of parameters of the process including the pressure and temperature of the glow discharge zone, the power density in the glow discharge and particularly the ratio of the amount of metal-free gaseous organic compound to carrier gas. The substrate may be a plastic such as polyimide, an aluminum or silicon oxide ceramics or glass.

12 Claims, No Drawings

METHOD OF MAKING A POLYMER-METAL COMPOUND HAVING A PREDETERMINED ELECTRICAL CONDUCTIVITY BY DEPOSITING ON A SUBSTRATE FROM A GLOW DISCHARGE ZONE

This application is a continuation-in-part application of the application Ser. No. 07/193,589 having a filing date of May 12, 1988.

BACKGROUND OF THE INVENTION

The present invention relates to a method of making a polymer-metal compound whose electrical conductivity varies within large limits and can be adjusted to a desired value and, more particularly, to a method of making an electrically-conductive polymer-metal compound of a predetermined conductivity on a substrate made of inorganic or organic material.

Methods of making an electrically conductive polymer-metal compound are known, in which methods volatile metallo-organic compounds are decomposed in a glow discharge zone in a reactor and are polymerized into the polymer-metal compound containing the metallic components. These methods are known as plasma polymerization methods.

A method of plasma polymerization of iron carbonyl and related iron metallo-organic compounds has been investigated by Sadhir and Saunders. This method is described in the article "Deposition of conducting thin films of organometallic monomers by plasma polymerization" by R. K. Sadhir and H. E. Saunders in J.Vac.Sci. Technol. A 3(6), 1985, pp. 2093-2097. In this method no additional metal-free organic compounds are used in the reactant mixture in which the glow discharge is formed so that an additional parameter effecting the ratio of metal to carbon in the discharge is not available. There is no teaching of a way to control the deposition so that a coating with a predetermined electrical conductivity can be obtained. The value of the conductivity of the conductive film which is produced depends on the geometry of the apparatus used to produce the film, especially the distance between the supply location of the metallo-organic compound and the substrate. It is understandable that a polymer-metal film with a predetermined desired resistance value cannot be produced by this method.

A method of producing conductive metal-fluorocarbon polymer films has been described by Perrin, Despax, Hanchett and Kay in the article, "Microstructure and electrical conductivity of plasma deposited gold/-fluorocarbon composite film" by J. Perrin, B. Despax, V. Hanchett and E. Kay, J.Vac.Sci.Technol. A 4(1), 1986, pp. 46 to 51. The substrate is exposed to a plasma discharge in a fluorocarbon and argon gas mixture in this method. Instead of using a gaseous metallo-organic compound as a source of metal atoms for the plasma produced in the fluorocarbons gold or other metal atoms are added to the composite film produced on the substrate by RF sputtering methods using a gold coated electrode. The method produces an organic polymer film, in which metallic particles in the form of numerous small spots spaced from each other are embedded. These films must contain at least about 50% metal atoms to be conductive. Typical properties of the films produced are the limited values of "spot density" and the 50% threshold for film conductivity. Thus, it is almost impossible to obtain a film with an electrical conductivity above a certain value.

Morosoff and Haque have studied the plasma polymerization of volatile transition metal compounds and $C_2$ hydrocarbons. A coating was formed by exposing a substrate to a plasma made in a reactant gas containing an iron carbonyl and a $C_2$ hydrocarbon. The nature of the products and chemical processes occurring during film formation was determined. No measurements of electrical conductivity were made however and there was no study of the effect of varying process parameters on the electrical conductivity of the film formed, so that there is no way to know if an electrically conductive polymer layer would form under the conditions used in their experiments. Similarly there is no suggestion that their method could be used to produce an electrically conductive layer. This work was described in the article "Transition metal containing plasma polymers" by N. Morosoff and R. Haque and S. D. Clymer and A. L. Crumbliss in J.Vac.Sci.Technol. A 3(6), 1985, pp.2096 to 2101.

SUMMARY OF THE INVENTION

It is an object of the present invention to provide a method of producing a polymer-metal compound by a vapor deposition and reaction process in a glow discharge, which utilizes a volatile metallo-organic compound and a metal-free gaseous organic compound as starting materials.

This and other objects of the present invention are attained by a method of making an electrically conductive polymer-metal compound on an organic or inorganic substrate, comprising the steps of preparing a reaction mixture of a gaseous metallo-organic compound and a metal-free gaseous organic compound, producing a glow discharge zone in said reaction mixture and exposing the substrate to action of the gaseous metallo-organic compound and the metal-free gaseous organic compound in the glow discharge zone to produce a film of an electrically conductive polymer-metal compound of a predetermined electrical conductivity.

By gaseous metallo-organic and metal-free organic compounds used in our process we mean those compounds which are sufficiently volatile and sublimable so that they can be used under the operational conditions of a plasma reactor in our process.

The method may also include a step of additionally heating the metallo-organic compound in a supply container to produce the gaseous metallo-organic compound need for the reaction mixture.

The method may additionally include a step of supplying a carrier gas which is admixed with the metal-free gaseous organic compounds and gaseous metallo-organic compounds before plasma polymerization in the reactor.

The carrier gas may be an inert gas selected from the group consisting of argon and helium and the carrier gas may be admixed with a reducing gas such as hydrogen.

To make a polymer-metal compound having a predetermined resistance and/or conductivity, particularly the ratio between the amounts of the metal-free gaseous organic compound used and the carrier gas in the reaction mixture should be pre-selected.

However other parameters such as the total pressure in the glow discharge, the temperature of the electrodes of the reactor used to produce the discharge zone and the temperature in the glow discharge and the power density in the glow discharge zone may be preselected and controlled to predetermine the polymer-metal compound electrical conductivity or resistance.

The invention is especially applicable to a manufacturing process for production of resistors on inorganic or organic nonconducting substrates and integrated circuits containing these resistors. Antistatic layers and radiation-shielding layers for sensitive electronic circuits can be produced using the methods of our invention. Almost any shape substrate may be coated by these methods including film, plate, disc and large surface area substrates.

The polymer-metal compounds produced by the method of our invention have properties which are entirely different from the films and coatings which have been made in the prior art. It is possible to produce electrical conductivities over a wide range of orders of magnitude. The conductivities of the films produced by the method of our invention have an approximately simple linear dependence on film composition. Predetermined conductivities can be simply obtained by an exact metering of the gaseous metallo-organic compound and the metal-free gaseous organic compound supplied to the reactant mixture in which the glow discharge is generated. The control of the composition of the film can be improved particularly when the inert carrier gas, especially argon, is used.

The specific advantages of the method of our invention are based on the mechanism of the film formation on the substrate.

In contradistinction to conventional methods a metal-carrying metallo-organic molecule is first absorbed on an outer surface of the substrate and then, due to reaction with the plasma and its ions, electrons and protons, is converted a free metal-containing fragment. Thus, not only is the substrate etched by the plasma, but also the metallo-organic molecule, depending on the intensity and duration of the operation, is decomposed into greater or smaller metallic fragments. When the organic component of the fragments is not entirely removed the films are produced by combination of the gaseous organic molecules and metallo-organic fragments. Organic monomers are then embedded in a polymeric matrix in the produced films. Because of this mechanism the film formed does not include the metal in the form of crystals or localized spots or aggregates.

These features of the mechanism operating in the glow discharge zone, when taken together with the simple control of film properties by adjustment of certain operational parameters of our method, make possible a "custom-made" production of resistors, for example for sensors, integrated circuits and other applications.

A further advantage of the process according to our invention is that the substrate is extraordinarily well preserved and is exposed to only a very small energy density. Thus, sensitive plastics which are strongly damaged during the cathode sputtering can also be used as an organic substrate in our process and coated with films.

The methods of our invention can take place in a conventional plasma reactor. The plasma reactor, in which the glow discharge zone is produced in the reaction mixture, can be a pipe reactor, tunnel reactor or parallel plate reactor. The plasma may be produced by D.C. current or alternating current. High frequency alternating current may be used. The pressure in the plasma reactor is advantageously 5 to 100 Pa, which is also advantageous compared to the high vacuum conditions required in cathode sputtering or vapor-deposition. No high vacuum with pressure less than 3 Pa is required.

The substrates used in our process can be inorganic substrates, particularly inorganic nonconducting substrates such as aluminum oxide ceramics, silicon oxide ceramics and glass. Metals with oxide and nitrite layers may also be used as substrates. Organic substrates can also be used. The organic substrates which can used include especially plastics, which can be particularly sensitive. Polyimide can be used as one of the organic substrates of the invention.

All metallo-organic compounds, which are volatile or sublimable under the proposed vacuum conditions, are suitable as the gaseous metallo-organic compounds of the invention. The transport of both the metal-free gaseous organic compounds and metallo-organic compounds of the invention into the glow discharge occurs by generation of a pressure differential by vacuum techniques so that a uniform gas reactant mixture is provided in the glow discharge zone. The supply containers for either or both the metallo-organic compound and the gaseous metal-free organic compound can be provided with a heating device for conveying compounds, which are more difficult to vaporize in sufficient amounts into the gas flow to the glow discharge zone.

The following metallo-organic compounds may be used as the gaseous metallo-organic compounds of our invention:
Dimethylgold(III)-acetylacetonate
Copper hexafluoroacetylacetonate
Nickel hexafluoroacetylacetonate
Allylcyclopentadienylpalladium (II)
Tin tetramethyl
Tin tetraethyl
Nickel tetracarbonyl
Molybdenum hexacarbonyl
Dicobaltoctocarbonyl Saturated and unsaturated hydrocarbons can be used as the gaseous metal-free organic compounds of the invention. These compounds enter into polymerization reactions under the action of the glow discharge. The following are examples of the gaseous metal-free organic compounds of the method of our invention: methane, ethane, propane, butane, ethylene, propene, butenes, pyridine, piperidine and morpholine.

The following examples, which are all performed in a parallel plate reaction well known in the prior art, are set forth below to clarify the invention.

EXAMPLES

Example I. Polymeric Palladium Layer

Allylcyclopentadienyl palladium (II), the metallo-organic compound, and propene, the metal-free gaseous organic compound, are admitted to a parallel plate reactor in an argon carrier gas. An aluminum oxide ceramic substrate is exposed to a glow discharge zone formed in this reaction mixture between the electrodes of the parallel plate reactor. A voltage of 400 D.C. volts is applied to the electrodes. The electrodes are maintained at a temperature of 30° C. The power density at the electrodes is 0.1 watt/cm$^2$. The pressure in the reactor in the glow discharge is 20 Pa. The substrate is exposed to the glow discharge in this reaction mixture for 100 minutes to form an 0.5 micrometer thick film.

Different ceramic plates were coated one after the other under the above operational conditions. Each time a plate was coated the ratio between the amount of propene and argon in the gas mixture was changed. The proportion of gaseous metal, palladium, is maintained constant, because it is provided by the vapor pressure, since the supply container for the palladium compound is not heated in this example.

Electrical resistance of the deposited polymeric palladium layer has been measured according to a four-point method in the apparatus of Kulicke and Soffa, Model 331. These resistances are shown in Table I.

TABLE I

| Resistance of Polymeric Palladium Layer vs % Propene in the Gas Phase | | | |
|---|---|---|---|
| % Propene in Reaction Mixture | Gas Flow Rate, sccm | Pd in the Film, % by weight | Resistance, $\mu\Omega$ cm |
| 0 | 20 | 75 | $5.8 \cdot 10^4$ |
| 33 | 20 | 71 | $1.6 \cdot 10^7$ |
| 50 | 20 | 59 | $1.1 \cdot 10^8$ |
| 67 | 20 | 43 | $1.0 \cdot 10^8$ |
| 100 | 20 | 0 | $1.0 \cdot 10^8$ | where "sccm" means standard cm. $\min^{-1}$

As the table shows the resistance of the polymeric palladium films formed in this example is variable over a wide range of order of magnitudes.

Example II. Polymeric Palladium Layer on Inorganic Substrate

Allylcyclopentadienyl palladium (II), the metallo-organic compound, and acrylonitrile, the metal-free gaseous organic compound, are admitted to a parallel plate reactor with an argon carrier gas. An aluminum oxide ceramic substrate is exposed to a glow discharge zone formed in this reaction mixture between the electrodes of the parallel plate reactor. A voltage of 400 D.C. volts is applied to the electrodes. The electrodes are maintained at a temperature of 120° C. The power density at the electrodes is 0.1 watt/cm². The pressure in the reactor in the glow discharge is 20 Pa. The substrate is exposed to the glow discharge in this reaction mixture for 100 minutes to form an 0.5 micrometer thick film.

Different ceramic plates were coated one after the other under the above operational conditions. Each time a plate was coated the ratio between the amount of acrylonitrile and argon in the gas mixture was changed. The proportion of gaseous metal, palladium, is maintained constant, because it is provided by the vapor pressure, since the supply container for the palladium compound is not heated in this example.

Electrical resistance of the deposited polymeric palladium layer has been measured according to a four-point method in the apparatus of Kulicke and Soffa, Model 331. These resistances are shown in Table II and are generally several orders of magnitude less than those of Example I.

TABLE II

| Resistance of Polymeric Palladium Layer vs % Acrylonitrile in the Gas Phase | | | |
|---|---|---|---|
| % Acrylonitrile in Reaction Mixture | Gas Flow Rate, sccm | Pd in the Film, % by weight | Resistance, $\mu\Omega$ cm |
| 0 | 100 | 94 | $4.3 \cdot 10^2$ |
| 20 | 100 | 49 | $5.2 \cdot 10^7$ |
| 25 | 100 | 47 | $9.1 \cdot 10^7$ |
| 50 | 100 | 42 | $> 1.0 \cdot 10^8$ | where "sccm" means standard cm. $\min^{-1}$.

Example III. Polymeric Gold Layer on Polyimide

Dimethylgold(III)-acetylacetonate, the metallo-organic compound, and propene, the metal-free gaseous organic compound, are admitted to a parallel plate reactor with an argon carrier gas. A polyimide organic substrate is exposed to a glow discharge zone formed in this reaction mixture between the electrodes of the parallel plate reactor. A 13.56 Mhz alternating voltage is applied to the electrodes. The electrodes are maintained at a temperature of 25° C. The power density at the electrodes is 0.05 watt/cm². The pressure in the reactor in the glow discharge is 20 Pa. The substrate is exposed to the glow discharge in this reaction mixture for 90 minutes to form an 0.5 micrometer thick film. The supply container for the organo-metallic was heated at 60° C.

Different ceramic plates were coated one after the other under the above operational conditions. Each time a plate was coated the ratio between the amount of propene and argon in the gas mixture was changed.

Electrical resistance of the deposited polymeric gold layer has been measured according to a four-point method in the apparatus of Kulicke and Soffa, Model 331. These resistances are shown in Table III.

TABLE III

| Resistance of Polymeric Gold Layer vs % Propene in the Gas Phase | | | |
|---|---|---|---|
| % Propene in Reaction Mixture | Gas Flow Rate, sccm | Au in the Film, % by weight | Resistance, $\mu\Omega$ cm |
| 0 | 0 | 73 | $2.0 \cdot 10^3$ |
| 3 | 5 | 59 | $1.3 \cdot 10^7$ |
| 7 | 10 | 50 | $2.5 \cdot 10^7$ |
| 10 | 15 | 40 | $> 1.0 \cdot 10^8$ | where "sccm" means standard cm. $\min^{-1}$.

Example IV. Polymeric Tin Layer on Silicate Glass

Tin tetramethyl, the metallo-organic compound, and propene, the metal-free gaseous organic compound, are admitted to a parallel plate reactor with an argon carrier gas. A silicate glass substrate is exposed to a glow discharge zone formed in this reaction mixture between the electrodes of the parallel plate reactor. A 13.56 Mhz alternating voltage is applied to the electrodes. The power density at the electrodes is 0.4 watt/cm². The pressure in the reactor in the glow discharge is 25 Pa. The inorganic substrate is exposed to the glow discharge in this reaction mixture for 60 minutes to form a 2 micrometer thick film. The electrodes were maintained at a temperature of 100° C. The supply container for the organo-metallic was not heated.

Different ceramic plates were coated one after the other under the above operational conditions. Each time a plate was coated the ratio between the amount of propene and argon in the gas mixture was changed.

Electrical resistance of the deposited polymeric tin layer has been measured according to a four-point method in the apparatus of Kulicke and Soffa, Model 331. These resistances are shown in Table IV.

TABLE IV

Resistance of Polymeric Tin Layer vs % Propene in the Gas Phase

| % Propene in Reaction Mixture | Gas Flow Rate, sccm | Sn in the Film, % by weight | Resistance, $\mu\Omega$ cm |
|---|---|---|---|
| 0 | 0 | 95 | 90 |
| 3 | 1 | 94 | 500 |
| 5 | 2 | 92 | 800 |
| 10 | 4 | 78 | $>1.0.10^8$ | where "sccm" means standard cm. $\min^{-1}$.

Example V. Polymeric Cobalt Layer on Silicon Oxide Ceramic

Dicobaltoctacarbonyl, the metallo-organic compound, and propene, the metal-free gaseous organic compound, are admitted to a parallel plate reactor with an argon-hydrogen carrier gas. A silicon oxide ceramic substrate is exposed to a glow discharge zone formed in this reaction mixture between the electrodes of the parallel plate reactor. A 13.56 Mhz alternating voltage is applied to the electrodes. The power density at the electrodes is 0.6 watt/cm$^2$. The pressure in the reactor in the glow discharge is 22.5 Pa. The inorganic substrate is exposed to the glow discharge in this reaction mixture for 90 minutes to form a 0.5 micrometer thick film. The electrode temperature was 80° C.

Different ceramic plates were coated one after the other under the above operational conditions. Each time a plate was coated the ratio between the amount of propene and argon in the gas mixture was changed.

Electrical resistance of the deposited polymeric tin layer has been measured according to a four-point method in the apparatus of Kulicke and Soffa, Model 331. These resistances are shown in Table V.

TABLE V

Resistance of Polymeric Cobalt Layer vs % Propene in the Gas Phase

| % Propene in Reaction Mixture | Gas Flow Rate, sccm | Co in the Film, % by weight | Resistance, $\mu\Omega$ cm |
|---|---|---|---|
| 1.5 | 1 | 78 | $2.5.10^3$ |
| 3. | 2 | 76 | $3.8.10^3$ |
| 4.4 | 3 | 72 | $5.2.10^3$ |
| 9.0 | 4 | 62 | $3.7.10^3$ |
| 13. | 6 | 43 | $>1.0.10^8$ | where "sccm" means standard cm. $\min^{-1}$

Example VI. Polymeric Tin Layer on Silicate Glass

Tetramethyl tin, the metallo-organic compound, and butane, the metal-free gaseous organic compound, are admitted to a parallel plate reactor in an argon carrier gas. A silicate glass substrate is exposed to a glow discharge zone formed in this reaction mixture between the electrodes of the parallel plate reactor. An alternating voltage at 13.56 Mhz was applied to the electrodes. The electrodes are maintained at a temperature of 100° C. The power density at the electrodes is 0.4 watt/cm$^2$. The pressure in the reactor in the glow discharge is 25 Pa. The substrate is exposed to the glow discharge in this reaction mixture for 60 minutes to form an 2 micrometer thick film.

Different ceramic plates were coated one after the other under the above operational conditions. Each time a plate was coated the ratio between the amount of butane and argon in the gas mixture was changed. The proportion of gaseous metal, tin, is maintained constant, because it is provided by the vapor pressure, since the supply container for the tin compound is not heated in this example.

Electrical resistance of the deposited polymeric tin layer has been measured according to a four-point method in the apparatus of Kulicke and Soffa, Model 331. These resistances are shown in Table VI.

TABLE VI

Resistance of Polymeric Tin Layer vs % Butane in the Gas Phase

| % Butane in Reaction Mixture | Gas Flow Rate, sccm | Sn in the Film, % by weight | Resistance, $\mu\Omega$ cm |
|---|---|---|---|
| 0 | 0 | 95 | 90 |
| 5 | 2 | 91 | 2000–5000 |
| 10 | 4 | 82 | $(19-22).10^4$ |
| 15 | 6 | 80 | $(65-97).10^4$ |
| 20 | 8 | 70 | $(4-5).10^6$ | where "sccm" means standard cm. $\min^{-1}$

It will be understood that each of the elements described above, or two or more together, may also find a useful application in other types of constructions differing from the types described above.

While the invention has been illustrated and described as embodied in a method of making a polymer-metal compound having a predetermined electrical conductivity by depositing on a substrate from a glow discharge zone, it is not intended to be limited to the details shown, since various modifications and structural changes may be made without departing in any way from the spirit of the present invention.

Without further analysis, the foregoing will so fully reveal the gist of the present invention that others can by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. A method of making an electrically conductive polymer-metal compound on a substrate comprising the steps of preparing a reaction mixture of a gaseous metallo-organic compound and a metal-free gaseous organic compound, producing a glow discharge zone in said reaction mixture and exposing the substrate to action of the gaseous metallo-organic compound and the metal-free gaseous organic compound in the glow discharge zone so as to produce the electrically conductive polymer-metal compound with a predetermined electrical conductivity.

2. A method according to claim 1, wherein the metallo-organic compound is volatile and sublimable under operation conditions during the exposing.

3. A method according to claim 1, further comprising a step of additionally heating the metallo-organic compound in a supply container.

4. A method according to claim 1, further comprising a step of admixing a carrier gas with the reaction mixture prior to the exposing.

5. A method according to claim 4, wherein said carrier gas is selected from the group consisting of argon, helium, hydrogen and mixtures of argon and hydrogen.

6. A method according to claim 4, further comprising a step of preselecting a ratio of amounts of said metal-free gaseous organic compound and said carrier gas to produce said polymer-metal compound having said predetermined electrical conductivity.

7. A method according to claim 1, wherein said glow discharge is characterized by a plurality of parameters including a pressure, a temperature and a power density in the glow discharge zone and further comprising preselecting and controlling at least one of said parameters to predetermine the polymer-metal compound electrical conductivity.

8. A method according to claim 1, wherein said substrate is an inorganic substrate selected from the group consisting of aluminum oxide ceramics, silicon oxide ceramics, glass and metals with oxide and nitrite layers.

9. A method according to claim 1, wherein said metallo-organic compound is selected from the group consisting of dimethylgold(III)-acetylacetonate, copper hexafluoroacetylacetonate, nickel hexafluoroacetylacetonate, allylcyclopentadienylpalladium(II), tin tetramethyl, tin tetraethyl, nickel tetracarbonyl, molybdenum hexacarbonyl and dicobaltocatocarbonyl.

10. A method according to claim 1, wherein said metal-free gaseous organic compound is selected from the group consisting of methane, ethane, propane, butane, acrylonitrile, ethylene, propene, butenes, pyridine, piperdine and morpholine.

11. A method according to claim 1, wherein said substrate is a plastic.

12. A method according to claim 11, wherein said plastic is polyimide.

* * * * *